United States Patent
Moon et al.

(10) Patent No.: US 9,030,009 B2
(45) Date of Patent: May 12, 2015

(54) STACKED SEMICONDUCTOR PACKAGE AND METHOD FOR MANUFACTURING THE SAME

(71) Applicant: SK Hynix Inc., Icheon-si Gyeonggi-do (KR)

(72) Inventors: Ki Il Moon, Yongin-si (KR); Jae Sung Oh, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 6 days.

(21) Appl. No.: 14/051,679

(22) Filed: Oct. 11, 2013

(65) Prior Publication Data
US 2014/0361426 A1 Dec. 11, 2014

(30) Foreign Application Priority Data
Jun. 11, 2013 (KR) .......... 10-2013-0066611

(51) Int. Cl.
H01L 21/768 (2006.01)
H01L 23/538 (2006.01)
H01L 23/00 (2006.01)

(52) U.S. Cl.
CPC .......... *H01L 24/14* (2013.01); *H01L 21/76898* (2013.01); *H01L 24/67* (2013.01)

(58) Field of Classification Search
CPC ............. H01L 21/76898; H01L 2224/94; H01L 2224/97; H01L 2224/05552
See application file for complete search history.

(56) References Cited

U.S. PATENT DOCUMENTS

| 2007/0210447 A1* | 9/2007 | Kinsley | 257/723 |
| 2008/0169545 A1* | 7/2008 | Kwon et al. | 257/686 |
| 2012/0088332 A1* | 4/2012 | Lee et al. | 438/113 |
| 2013/0292845 A1* | 11/2013 | Choi | 257/774 |

FOREIGN PATENT DOCUMENTS

KR 1020120035719 A 4/2012

* cited by examiner

*Primary Examiner* — Shaun Campbell
*Assistant Examiner* — Raj R Gupta
(74) *Attorney, Agent, or Firm* — William Park & Associates Ltd.

(57) ABSTRACT

A stacked semiconductor package includes: a first semiconductor chip formed with a first through electrode, the first through electrode protruding above a first surface of the first semiconductor chip; a first polymer layer formed over the first surface of the first semiconductor chip such that the first through electrode is exposed by the first polymer layer; a second semiconductor chip having a first surface attached onto the first semiconductor chip by medium of the first polymer layer and a vial hole passing through the second semiconductor chip, the first surface of the second semiconductor chip being formed with a bonding pad having a through hole which corresponds to the first through electrode; and a second through electrode located within the through hole and the via hole and is electrically connected with the first through electrode.

11 Claims, 12 Drawing Sheets

STACKED SEMICONDUCTOR PACKAGE AND METHOD FOR MANUFACTURING THE SAME

CROSS-REFERENCES TO RELATED APPLICATIONS

The present application claims priority to Korean patent application number 10-2013-0066611 filed on Jun. 11, 2013, in the Korean Intellectual Property Office, which is incorporated herein by reference in its entirety.

BACKGROUND

1. Technical Field

The present invention generally relates to a semiconductor technology, and more particularly, to a stacked semiconductor package and a method for manufacturing the same.

2. Related Art

In the semiconductor industry, packaging technologies for integrated circuits have been continuously been developed to satisfy the demands toward miniaturization and mounting reliability. In recent years, as miniaturization and higher performances are demanded in electric and electronic products, various stacking techniques have been developed.

The term "stack" as used in the semiconductor industry means to pile vertically two or more semiconductor chips or semiconductor packages. With these stacking technologies, a memory element may have a memory capacity two or more times greater than that obtainable through semiconductor integration process. Besides the increased memory capacity, the stacked semiconductor packages also have advantages in terms of mounting density and efficient utilization of a mounting area. For these reasons, research and development for stacked semiconductor packages have been accelerated.

As an example of a stacked semiconductor package, a structure has been introduced in which through electrodes are formed in semiconductor chips such that upper and lower semiconductor chips are physically and electrically connected with one another by the through electrodes. Typical process steps for manufacturing such stacked semiconductor package using the through electrodes are as follows:

Via holes are defined at respective semiconductor chips through an etching process in a wafer level, and through electrodes are formed by filling a copper layer in the via. Front bumps connected with the through electrodes are then formed on a front surface of a wafer. Thereafter, with a support substrate attached to the front surface of the wafer in order to prevent warpage and crack from generated in the wafer during a subsequent back grinding process, a back surface of the wafer is back ground to expose the through electrodes and back bumps are then formed over the through electrodes at the back surface of the wafer. After detaching the support substrate, the semiconductor chips of the wafer are individualized by sawing the wafer. Then, the individualized semiconductor chips are stacked such that front bumps of the upper semiconductor chip are bonded on the back bumps of the lower semiconductor chip by medium of solder balls, thereby forming a stacked semiconductor package.

The stacked semiconductor package using such through electrodes has an advantage in that high operation speed and miniaturization can be achieved since electrical connections are made through the through electrodes.

The conventional stacked semiconductor packages, however, have disadvantages in that costs for forming bumps and solder balls are incurred and in that the upper and lower semiconductor chips are not electrically connected when the bumps and solder balls are not in place. The conventional stacked semiconductor packages have further disadvantages of poor electrical reliability and properties, e.g. decreased signal transfer speed since the solder balls have a resistance larger than that of copper (Cu) which is used as material for through electrodes. Moreover, in the conventional stacked semiconductor packages, support substrate attaching process and support substrate detaching process are performed on the respective wafers in order to accomplish thinning of semiconductor chips. The substrate attaching process and support substrate detaching processes are expensive processes that require high costs. Therefore, the conventional stacked semiconductor packages have disadvantages in that high costs are incurred to perform these expensive processes on respective wafers. In addition, in the conventional stacked semiconductor packages, it is necessary to back grind the wafer as thinly as possible in order to improve ion gettering properties upon back grinding the wafer. However, thin back grinding may lower chip strength, which results in a problem in that chips may be damaged when handling thinned chips after the back grinding. Therefore, back grinding roughly on the wafer should be performed to prevent chip damage but it is difficult then to ensure the ion gettering properties discussed above.

SUMMARY

Various embodiments are generally directed to a stacked semiconductor package with reduced manufacturing cost and improved electrical reliability and properties, and a method for manufacturing the same.

In an embodiment of the present invention, a stacked semiconductor package includes:

a first semiconductor chip formed with a first through electrode, the first through electrode protruding above a first surface of the first semiconductor chip; a first polymer layer formed over the first surface of the first semiconductor chip such that the first through electrode is exposed by the first polymer layer; a second semiconductor chip having a first surface attached onto the first semiconductor chip by medium of the first polymer layer and a vial hole passing through the second semiconductor chip, the first surface of the second semiconductor chip being formed with a second bonding pad having a through hole which corresponds to the first through electrode, the vial hole being connected with the through hole, and the first through electrode being exposed by the via hole; and a second through electrode that fills in the through hole and the via hole and is electrically connected with the second bonding pad and the first through electrode.

In an embodiment of the present invention, a method for manufacturing a stacked semiconductor package includes: forming a first through electrode in a first semiconductor chip formed at a first surface of a first wafer; etching a second surface of the wafer opposing to the first surface such that the first through electrode is protruded above the second surface of the wafer; forming a first polymer layer that covers the second surface of the wafer and exposes the first through electrode; attaching a first surface of a second semiconductor chip onto the first semiconductor chip by medium of the first polymer layer, the first surface of the second semiconductor chip being formed with a second bonding pad having a through hole which corresponds to the first through electrode; forming a second polymer layer over the first polymer layer including the second semiconductor chip; etching the second polymer layer and the second semiconductor chip to form a via hole which is connected with the through hole and by which the second bonding pad and the first through electrode are exposed; forming a second through electrode in the via hole and the through hole, the second through electrode being electrically connected with the second bonding pad and the first through electrode; and individualizing a stacked semiconductor package by cutting the first and second polymer layers and the wafer.

DETAILED DESCRIPTION

Hereafter, various embodiments of the present invention will be described in detail with reference to the accompanying drawings.

Figure 1:
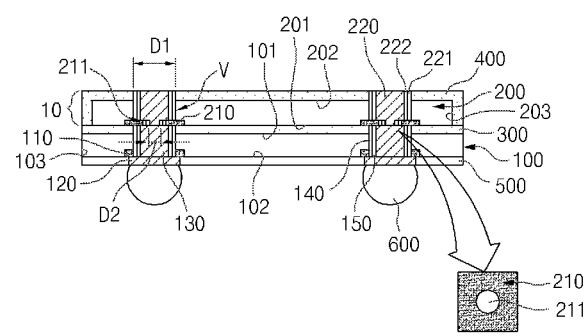
FIG. 1 is a cross-sectional view illustrating a stacked semiconductor package in accordance with an embodiment of the present invention.

Referring to FIG. 1, the stacked semiconductor package in accordance with an embodiment of the present invention may include first and second semiconductor chips 100 and 200, first and second polymer layers 300 and 400, and first and second through electrodes 130 and 220. The stacked semiconductor package in accordance with an embodiment of the present invention may further include a passivation layer 500 and external connection terminals 600.

The first semiconductor chip 100 may include a first surface 101, a second surface 102 opposing to the first surface 101, a circuit unit (not shown), a first bonding pad 110 and a bump 120.

The circuit unit may include semiconductor elements required for the operation of chips, e.g. transistors, capacitors, fuses, diodes and the like and wirings electrically connected with the semiconductor elements. The first bonding pad 110 is an electrical contact of the circuit unit for electrical connection with the outside and is formed over the second surface 102. The bump 120 is formed over the first bonding pad 110 and may include one or more selected from the group consisting of Cu, Ni, Al, carbon nanotube, Au, Ag, Pb, Sn, an alloy of Ag and Cu, an alloy of Pb and Sn, and an alloy of In and Bi.

The first through electrode 130 passes through the first and second surfaces 101 and 102 of the first semiconductor chip 100 and is protruded above the first surface 101. In the present embodiments, the first through electrode 130 passes through the first bonding pad 110 and is directly connected with the first bonding pad 110. Although the first through electrode 130 is shown and described as passing through the first bonding pad 110 in the present embodiments, the first through electrode 130 may not pass through the first bonding pad 110, in which case the first through electrode 130 is electrically connected with the first bonding pad 110 through the circuit unit.

A first insulation layer 140 is formed between the first through electrode 130 and the first semiconductor chip 100 for the purpose of insulation between the first through electrode 130 and the first semiconductor chip 100, and a first barrier metal layer 150 is formed between the first through electrode 130 and the first insulation layer 140 to prevent metal material of the first through electrode 130 from being diffused. The first insulation layer 140 may include a silicon oxide layer, a silicon nitride layer and the like, and the first barrier metal layer 150 may include Tin, TiW, WN and the like.

The first polymer layer 300 is formed over the first surface 101 of the first semiconductor chip 100 such that the first through electrode 130 is exposed out of the first polymer layer 300.

The second semiconductor chip 200 is attached onto the first semiconductor chip 100 by the medium of the first polymer layer 300. The second semiconductor chip 200 has a first surface 201 facing the first semiconductor chip 100, a second surface 202 opposing to the first surface 201, side surfaces 203 connecting the first surface 201 and the second surface 202. In the present embodiments, the second semiconductor chip 200 has an area smaller than that of the first semiconductor chip 100, and the side surfaces 203 of the second semiconductor chip 200 are disposed more inwardly than side surfaces 103 of the first semiconductor chip 100.

The first surface 201 of the second semiconductor chip 200 is formed with second bonding pads 210, each having a through hole 211 which corresponds to the first through electrode 130 of the first semiconductor chip 100. The second semiconductor chip 200 is provided with semiconductor elements required for the operation of chips, e.g. transistors, capacitors, fuses, diodes and the like and wirings electrically connected with the semiconductor elements. The second bonding pad 210 is an electrical contact of the circuit unit for electrical connection with the outside and is electrically connected with the circuit unit. The second semiconductor chip 200 are formed with via holes V, each of which is connected with the through hole 211 and exposes the second bonding pad 210 and the first through electrode 130. The via hole V has a larger diameter than the diameter of the through hole 211.

The second semiconductor chip 200 may be of a different kind from the first semiconductor chip 100. For example, the first semiconductor chip 100 may be a logic chip and the second semiconductor chip 200 may be a memory chip. Alternatively, the second semiconductor chip may be of the same kind as the first semiconductor chip 100.

The second polymer layer 400 is formed over the first polymer layer including the second semiconductor chip 200 such that it covers the second surface 202 of the second semiconductor chip 200 and surrounds the side surfaces 203 of the second semiconductor chip 200. The second polymer layer 400 is formed to expose via holes V.

The second through electrode 220 is formed by filling a metal layer such as a copper layer in the via hole V and the through hole 211 and is electrically connected with the second bonding pad 210 and the first through electrode 130.

A second insulation layer 221 may be formed between the second through electrode 220 and the via hole V, the through hole 211 and the side wall for the purpose of insulation between the second through electrode 220 and the second semiconductor chip 200, and a second barrier metal layer 222 may be formed between the second through electrode 220 and the second insulation layer 221 to prevent metal material of the second through electrode 220 from being diffused. The second insulation layer 221 may include a silicon oxide layer, a silicon nitride layer and the like, and the second barrier metal layer 222 may include Tin, TiW, WN and the like.

The second through electrode 220 contacts with the second bonding pad 210 at an edge of the bottom of the via hole V, and thus an electrical connection between the second through electrode 220 and the second bonding pad 210 is established.

The passivation layer 500 is formed over the second surface 102 of the first semiconductor chip 100 such that the bumps 120 are exposed, and the external connection terminals 600 are attached onto the bumps 120 exposed by the passivation layer 500.

Although the present embodiments are shown and described for a case where a semiconductor structure layer 10 including the second semiconductor chip 200, the second polymer layer 400 and the second through electrode 220 is stacked only in a single layer, the present invention is not limited to the present embodiments and also includes a case where the semiconductor structure layer 10 is stacked in two or more layers.

Figure 2:
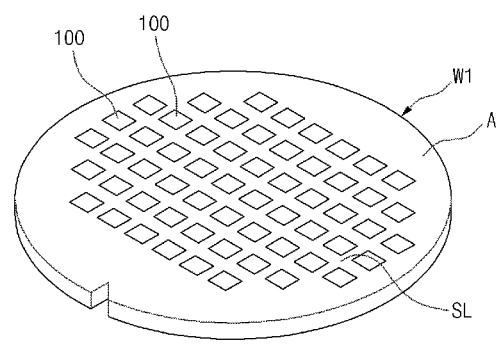
FIGS. 2 to 18 are views illustrating the process steps of manufacturing a stacked semiconductor package in accordance with an embodiment of the present invention.
Figure 3:
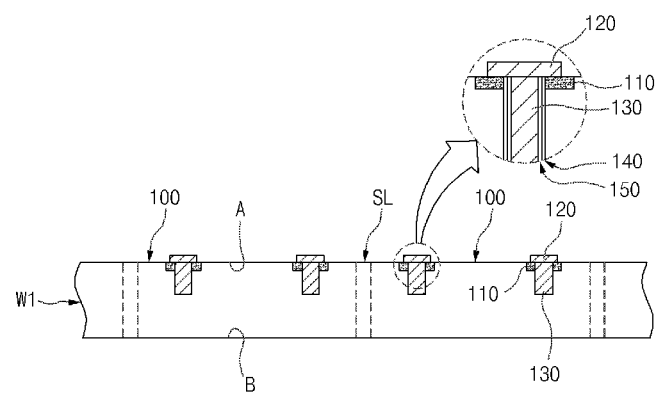

The process steps of manufacturing the stacked semiconductor package having the above described structure are as follows:

Referring to FIGS. 2 and 3, the first through electrode 130 is formed through each of a plurality of the first semiconductor chips formed on a first surface A of a first wafer W1.

In the first wafer W1, scribe lines SL are formed in a lattice form and the first semiconductor chips 100 are formed in respective areas defined by the scribe lines SL. Each of the first semiconductor chips 100 includes the circuit unit (not shown) and the first bonding pad 110. The circuit unit may include semiconductor elements required for the operation of chips, e.g. transistors, capacitors, fuses, diodes and the like and wirings electrically connected with the semiconductor elements. The first bonding pad 110 is an electrical contact of the circuit unit for electrical connection with the outside and is formed over the first surface A.

The first through electrode 130 may be formed, for example, by etching the first semiconductor chip 100 from the first surface A using a photolithographic process to form a blind via hole and then filling a metal material, e.g. copper in an inside of the via hole. In the present embodiments, the first through electrode 130 passes through the first bonding pad 110 and is directly connected with the first bonding pad 110.

For reference, a 3D integrated circuit (IC) process technologies using through electrodes may be largely classified into a via first, a via middle and a via last based on when the through electrode is formed. In case of the via first, after the through electrode is formed, Front-End-Of-Line (FEOL) process for forming semiconductor elements and Back-End-Of-Line (BEOL) process for forming wirings are performed. In case of the via middle, the through electrode is formed in a wafer to which the FEOL process has been completed and then BEOL process is performed. In case of the via last, the through electrode is formed in a wafer to which the FEOL process and the BEOL process have been completed.

In the present embodiments, the case of the via last, i.e. the case where the first through electrode 130 is formed in a wafer to which the FEOL process and the BEOL process have been completed is shown and described. However, the present inventions are not limited to this embodiment and the via first or the via middle can also be used. In case of using the via first or the via middle, since the FEOL/BEOL processes or the BEOL process are/is performed after the first through electrode 130 is formed, the first through electrode 130 is not exposed on the first surface A of the first wafer W1 and the first through electrode 130 is electrically connected with the first bonding pad 110 not directly but through the circuit unit.

Additionally, prior to forming the first through electrode 130, the first insulation layer 140 may be formed over the surface of the via hole for the purpose of insulation between the first through electrode 130 and the first semiconductor chip 100, and the first barrier metal layer 150 may be formed on the first insulation layer 140 to prevent metal material of the first through electrode 130 from being diffused. The first insulation layer 140 may include a silicon oxide layer, a silicon nitride layer and the like, and the first barrier metal layer 150 may include Tin, TiW, WN and the like.

Subsequently, the bump 120 is formed over the first bonding pad 110. The bump 120 may be formed, for example, by forming a metal layer for bump over the first surface A of the first wafer W1 using any one of an electroplating process, an electroless plating and a sputtering process, and then patterning the metal layer for bump with a photolithographic process. The metal layer for bump may include one or more selected from the group consisting of Cu, Ni, Al, carbon nanotube, Au, Ag, Pb, Sn, an alloy of Ag and Cu, an alloy of Pb and Sn, and an alloy of In and Bi.

Figure 4:
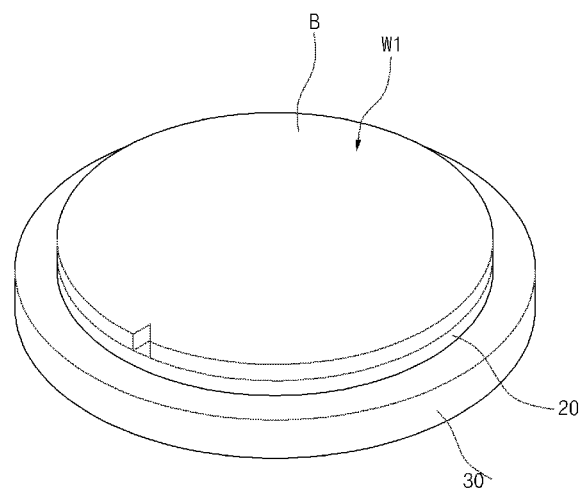
Figure 5:
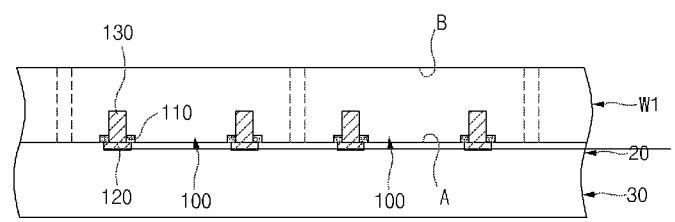

Referring to FIGS. 4 and 5, the first surface A of the first wafer W1 is attached to a support plate 30 by medium of an adhesive member 20. The adhesive member 20 may include an adhesive tape, a thermoplastic resin, an adhesive and the like, and the support plate 30 may include a bare silicon substrate, a glass substrate, a plastic substrate and the like.

Figure 6:
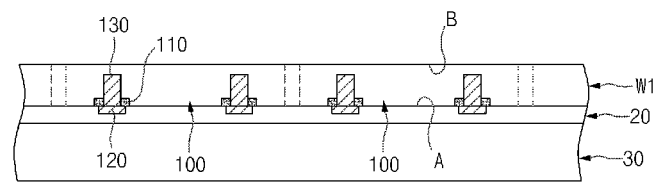

Referring to FIG. 6, the second surface B of the first wafer W1 is firstly etched to reduce the thickness of the first wafer W1 below 50 µm. A grinding process may be used as the first etching process. Although the first through electrode 130 is not exposed over the second surface B of the first wafer W1 after the first etching process in the present embodiments, the first through electrode 130 may be exposed over the second surface B of the first wafer W1, if necessary.

Figure 7:
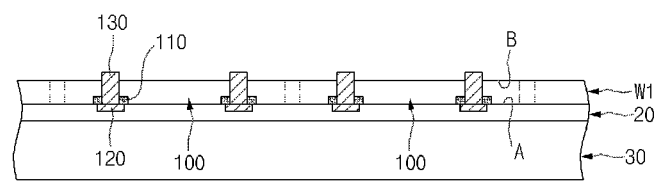

Referring to FIG. 7, the firstly etched second surface B of the first wafer W1 is secondly etched such that the first through electrode 130 is protruded above the second surface B of the first wafer W1. Chemical mechanical polishing (CMP) process may be used as the second etching process. At this time, slurry having a high polishing ratio of silicon with respect to copper is used such that the first through electrode 130 is not etched but only the first wafer W1 is selectively etched.

Figure 8:
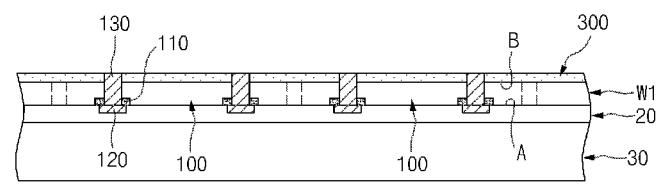

Referring to FIG. 8, polymer is adhered onto the first wafer W1 by applying the polymer over the second surface B of the first wafer W1 including the first through electrode 130 through a spin coating method and then curing the polymer through a curing process. After that, the polymer is polished through the CMP process such that the through electrode 130 is exposed, thereby forming the first polymer layer 300 that covers the second surface B of the first wafer W1 and exposes the first through electrode 130.

The present embodiments are shown and described for the case where the first through electrode 130 is protruded above the second surface B of the first wafer W1 and the first polymer layer 300 is formed such that it covers the second surface B of the first wafer W1 but exposes the through electrode 130. Alternatively, the first through electrode 130 is not protruded above the second surface B of the first wafer W1 and the first polymer layer 300 is formed such that it covers the second surface B of the first wafer W1 and the through electrode 130. In this case, the first polymer layer 300 is necessary to be etched such that the first through electrode 130 is exposed in a via hole etching process which will be described later with reference to FIG. 15.

Figure 9:
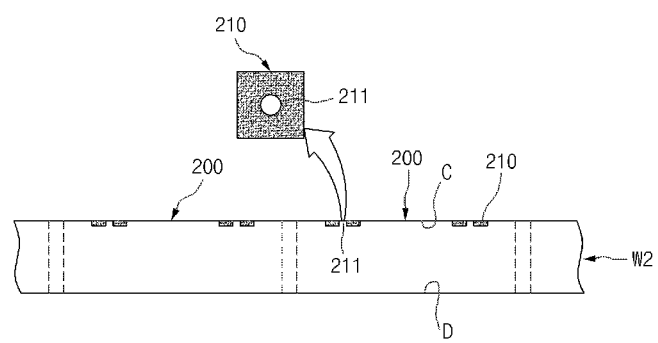

Referring to FIG. 9, a plurality of the second semiconductor chips 200 having second bonding pads 210 is formed over a first surface C of a second wafer W2. FIG. 9 also illustrates second surface D of second semiconductor chip 200. The second bonding pad 210 has the through hole 211 passing through the center of the second bonding pad 210. The second semiconductor chip may be of a different kind from the first semiconductor chip 100. For example, the first semiconductor chip 100 may be a logic chip and the second semiconductor chip 200 may be a memory chip. Alternatively, the second semiconductor chip may be of the same kind as the first semiconductor chip 100.

Figure 10:
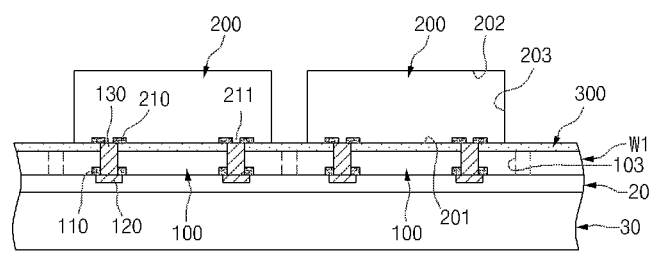

Referring to FIG. 10, the second semiconductor chips 200 are individualized by sawing the second wafer W2 without back grinding. After that, a surface 201 to be formed with the second bonding pad 210 (hereafter, referred to as 'first surface') of the second semiconductor chip 200, which passes the chip tests and is thus determined as qualified product, among the individualized second semiconductor chips 200 is attached onto the respective first semiconductor chips 100 by the medium of the first polymer layer 300 such that the through hole 211 of the second bonding pad 210 corresponds to the first through electrode 130. In the present embodiments, the second semiconductor chip 200 has an area smaller than that of the first semiconductor chip 100, and the side surfaces 203 of the second semiconductor chip 200 are disposed more inwardly than side surfaces 103 of the first semiconductor chip 100. Since the individualized second semiconductor chip 200 has the same thickness as that of the bare wafer, i.e. a thick thickness of over 200 µm, the second semiconductor chip 200 is not easily damaged during the process of handling the second semiconductor chip 200.

Figure 11:
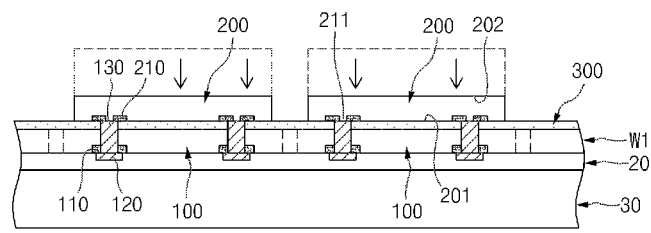

Referring to FIG. 11, the second surfaces 202 of the second semiconductor chips 200 opposing to the first surfaces 201 are etched (as indicated by the arrows and dotted lines) to reduce the thickness of the second semiconductor chips 200. Any one or more of grinding process and CMP process may be used as the etching process.

Figure 12:
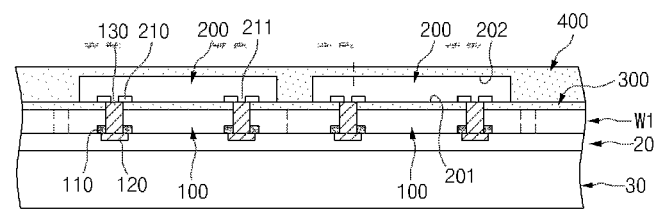

Referring to FIG. 12, polymer is adhered onto the second semiconductor chips 200 and the first polymer layer 300 by applying the polymer over the first polymer layer 300 including the second semiconductor chips 200 through a spin coating method and then curing the polymer through a curing process. After that, the upper surface of the polymer is planarized through a CMP process, thereby forming the second polymer layer 400.

Figure 13:
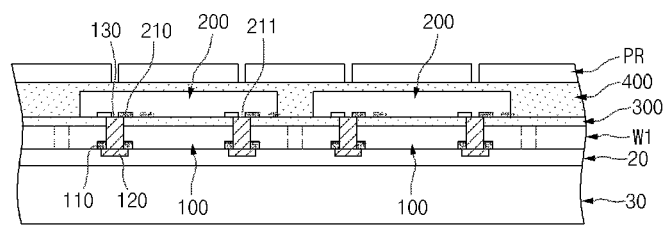

Referring to FIG. 13, a photoresist pattern PR is formed by applying a photoresist over the second polymer layer 400 and patterning the photoresist through exposure and development processes such that the portion of the second polymer layer 400 above the first through electrode 130 is exposed.

Figure 14:
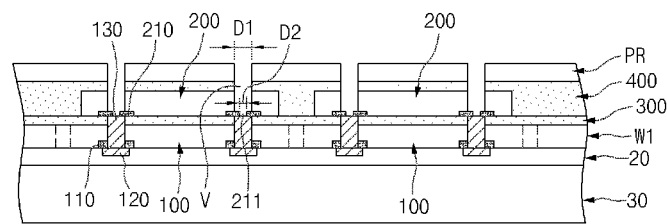

Referring to FIG. 14, the second polymer layer 400 and the second semiconductor chips 200 are etched using the photoresist pattern PR as a mask to form via holes V that are connected with the through holes 211 and expose the second bonding pads 210 and the first through electrodes 130. At this time, in order for the second bonding pad 210 to be connected with the second through electrode 220, which is to be formed in the inside of the via hole V in the subsequent process in FIG. 15, the diameter D1 of the via hole V is formed larger than the diameter D2 of the through hole 211.

Figure 15:
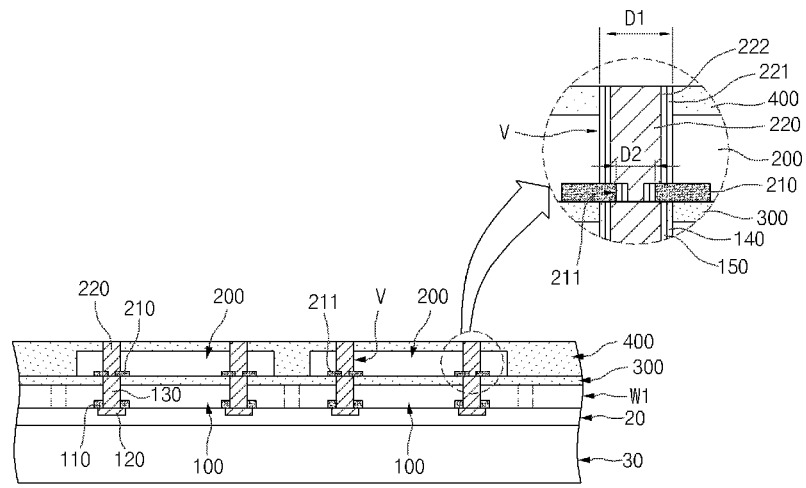

Referring to FIG. 15, the photoresist pattern PR is removed and the second insulation layer 221 and the second barrier metal layer 222 are sequentially formed over the second polymer layer 400 including the via hole V and the through hole 211. After that, portions of the second insulation layer 221 and the second barrier metal layer 222 formed on the upper portion of the second polymer layer 400 and the bottom of the via hole V and the through hole 211 are removed such that the second insulation layer 221 and the second barrier metal layer 222 remain on the side walls of the via hole V and the through hole 211, thereby exposing the second bonding pad 210 and the first through electrode 130. Subsequently, the second through electrode 220 is formed by filling a metal material, e.g. copper in an insides of the via hole and the through hole 211.

In order to form the second through electrode 220, there may be used a method of forming a metal layer over the second polymer layer 400 including the through hole 211 and the via hole V using any one of an electroplating process, an electroless plating process, a Chemical Vapor Deposition process and a Physical Vapor Deposition process such that the through hole 211 and the via hole V are filled with the metal layer and then removing the metal layer formed over the second polymer layer 400 using CMP process, or a method of growing a metal layer in a bottom-up type through an electroless plating process using the first through electrode 130 as a seed layer. The latter has advantages in that void-free gap fill is provided even though the via hole has a small aspect ratio and a CMP process is not required as a metal layer is not formed over the second polymer layer 400.

Figure 16:
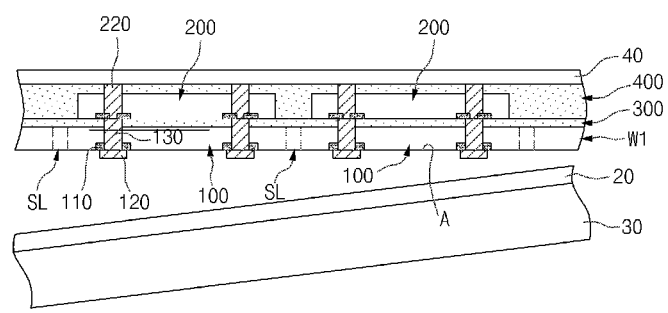

Referring to FIG. 16, a dicing tape 40 mounted on a wafer ring (not shown) is attached onto the second polymer layer 400, and then the adhesive member 20 and the support plate 30 attached to the surface A of the first wafer W1 are removed.

Figure 17:
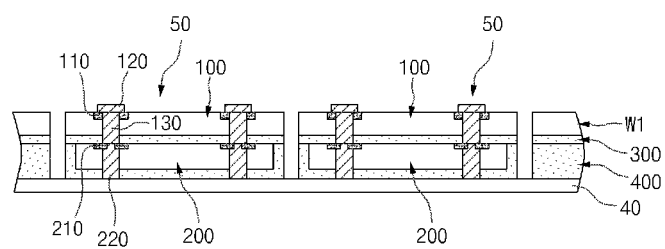
Figure 18:
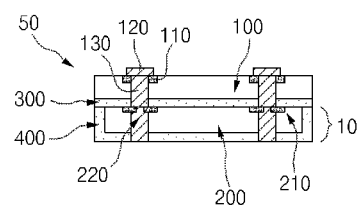

Referring to FIGS. 17 and 18, the first wafer W1 and the first and second polymer layers 300 and 400 are cut along the scribe lines SL (i.e., FIG. 16) to form stacked semiconductor packages 50, which are then detached from the dicing tape 40 and individualized.

After that, the passivation layer 500 that exposes the bumps 120 is formed over the lower surface of the first semiconductor chip 100 and the external connection terminals 600 are attached onto the bumps 120 exposed by the passivation layer 500, thereby forming a structure as shown in FIG. 1.

Although the present embodiments are shown and described for a case where a semiconductor structure layer 10 including the second semiconductor chip 200, the second polymer layer 400 and the second through electrode 220 is stacked only in a single layer by performing one time the processes described with reference to FIGS. 10 to 15, i.e. the processes of attaching the second semiconductor chip 200, thinning the second semiconductor chip 200, forming the second polymer layer 400, forming the via hole V and forming the second through electrode 220, the present inventions are not limited thereto and may include cases where the semiconductor structure layer 10 is stacked in two or more layers by performing two or more times a unit cycle including the processes as shown in FIGS. 10 to 15.

With the above described embodiments of the present invention, the through electrodes of the upper and lower semiconductor chips are directly connected without bumps or solder balls. Therefore, manufacturing costs caused by the formation of the bumps and solder balls can be saved. Also, it is possible to fundamentally avoid the problems in that the electrical connection between the upper and lower semiconductor chips is interrupted when the bumps and solder balls are not in place and electrical properties and reliability are lowered due to the use of the solder balls having high resistance. And, since the stacked semiconductor package in accordance with the present invention is manufactured by performing the process of attaching and detaching the support plate only one time regardless of the number of the chip to be stacked, costs caused by the processes of attaching and detaching the support plate can be saved.

Also, since the stacked semiconductor package in accordance with the present inventions are manufactured by handling thick semiconductor chips without back grinding, issues of chip handling difficulty and chip damage due to handling of thin semiconductor chips does not occur. Furthermore, in the stacked semiconductor package in accordance with the present invention, the back grinding is performed after stacking of the chips and thus the chip damage issue due to handling of thin semiconductor chips does not occur. Therefore, rough back grinding is enabled and gettering effects can be improved. In addition, in the stacked semiconductor package in accordance with the present invention, the number of process step and the resultant manufacturing costs can be reduced since a separate molding process is not required as the semiconductor chips are protected by the polymer layers and a separate underfill process is not required as the polymer layers are filled between the upper and lower semiconductor chips.

The stacked semiconductor package in accordance with various embodiments may be applied to a variety of electronic apparatuses.

Figure 19:
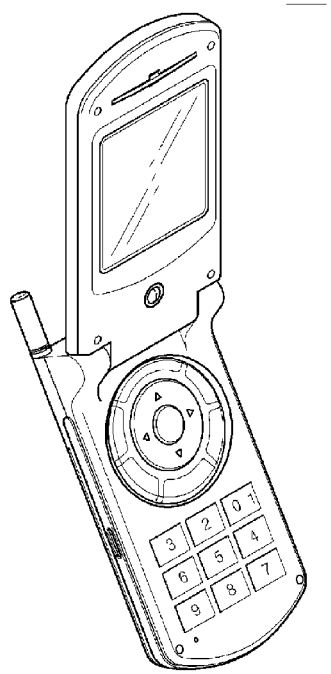
FIG. 19 is a perspective view illustrating an electronic apparatus having the stacked semiconductor package in accordance with various embodiments of the present invention.

FIG. 19 is a perspective view illustrating an electronic apparatus having the stacked semiconductor package in accordance with various embodiments.

As shown in FIG. 19, the stacked semiconductor package in accordance with various embodiments may be applied to an electronic apparatus 1000 such as a mobile phone. The stacked semiconductor package in accordance with various embodiments is important in improving cost competitiveness and reliability of the electronic apparatus 1000 since it can be manufactured at a low cost due to simpler processes and have improved mechanical and electrical reliability due to the materials used. The electronic apparatus 1000 is not limited to the mobile phone shown in FIG. 19, and may include various electronic appliances, such as a mobile electronic appliance, a laptop computer, a notebook computer, a portable multimedia player (PMP), an MP3 player, a camcorder, a web tablet, a wireless phone, a navigator, a personal digital assistant (PDA), and so forth.

Figure 20:
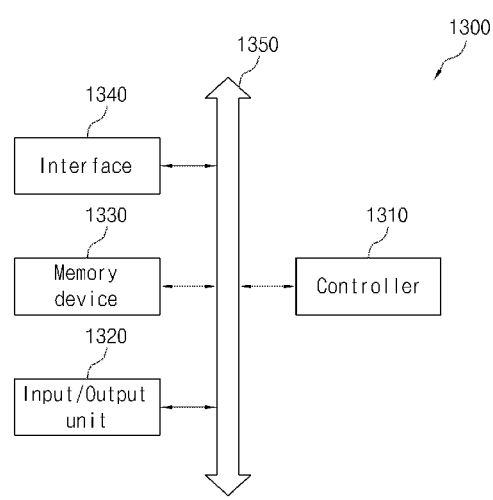
FIG. 20 is a block diagram showing an electronic system to which the stacked semiconductor package in accordance with various embodiments of the present invention is applied.

FIG. 20 is a block diagram illustrating an electronic system which may include the stacked semiconductor package according to various embodiments.

As shown in FIG. 20, an electronic system 1300 may include a controller 1310, an input/output unit 1320, and a memory device 1330. The controller 1310, the input/output unit 1320 and the memory device 1330 may be coupled with one another through a bus 1350. The bus 1350 serves as a path through which data move. For example, the controller 1310 may include at least any one of the following: one or more microprocessors, one or more digital signal processors, one or more microcontrollers, and logic devices capable of performing the same functions as these components. The memory device 1330 may include the semiconductor package according to various embodiments of the present invention. The input/output unit 1320 may include at least one selected among a keypad, a keyboard, a display device, and so forth. The memory device 1330 is a device for storing data. The memory device 1330 may store data and/or commands to be executed by the controller 1310 and the like.

The memory device 1330 may include a volatile memory device and/or a nonvolatile memory device, such as a flash memory. For example, a flash memory to which the technology of the present invention is applied may be mounted to an information processing system such as a mobile terminal or a desktop computer. The flash memory may be constituted by a solid state drive (SSD). In this case, the electronic system 1300 may stably store a large amount of data in a flash memory system.

The electronic system 1300 may further include an interface 1340 configured to transmit and receive data to and from a communication network. The interface 1340 may be a wired or wireless type. For example, the interface 1340 may include an antenna or a wired (or wireless) transceiver. Furthermore, though not shown, a person skilled in the art will readily appreciate that the electronic system 1300 may additionally include an application chipset, a camera image processor (CIP), etc.

Figure 21:
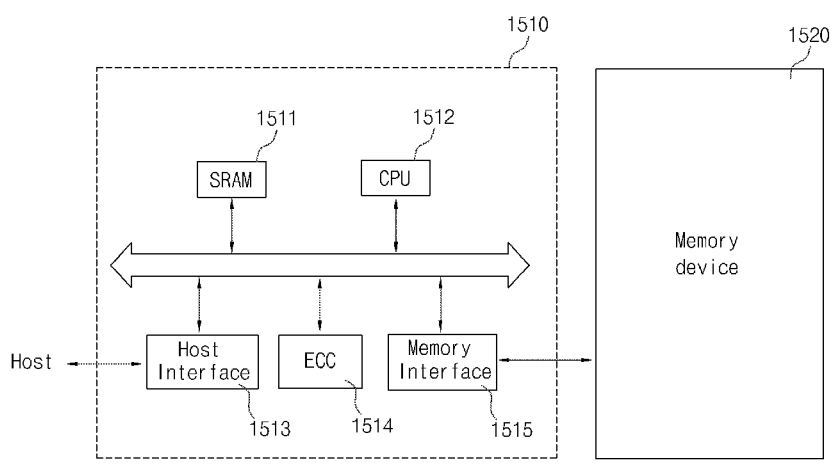
FIG. 21 is a block diagram illustrating a memory system to which the stacked semiconductor package in accordance with various embodiment of the present invention is applied.

FIG. 21 is a block diagram illustrating a memory system which may include the stacked semiconductor package according to various embodiments of the present invention.

Referring to FIG. 21, the memory system 1500 of the present embodiments may include a memory device 1520 and a memory controller 1510.

The memory device 1520 may serve as a volatile memory device such as a dynamic random-access memory (DRAM) or a nonvolatile memory device such as a magnetoresistive RAM (MRAM), spin torque transfer MRAM (STT-MRAM), phase-change RAM (PCRAM), resistive RAM (ReRAM), or ferroelectric RAM (FeRAM). The memory device 1520 may include a stacked semiconductor package according to various embodiments of the present invention.

The memory controller 1510 may control the memory device 1520, and may include a static random-access memory (SRAM) 1511, a central processing unit (CPU) 1512, a host interface 1513, an error correction code block (ECC) 1514 and a memory interface 1515. The SRAM 1511 is used as an operation memory of the CPU 1512, the CPU 1512 performs control operation for data exchange of the memory controller 1510, and the host interface 1513 has data exchange protocol of a host accessed to the memory system 1500. The ECC 1514 detects and corrects error of data read from the memory device 1520, and the memory interface 1515 interfaces with the semiconductor memory device 1520. The memory controller 1510 may further include read-only memory (ROM) for storing data for interfacing with the host, etc.

The memory system 1500 may be used as a memory card or a solid state disk SSD by combination of the memory device 1520 and the memory controller 1510. In the event that the memory system 1500 is the SSD, the memory controller 1510 communicates with an external device, e.g. host through one of various interface protocols such as USB, MMC, PCI-E, SATA, PATA, SCSI, ESDI, IDE, etc.

Figure 22:
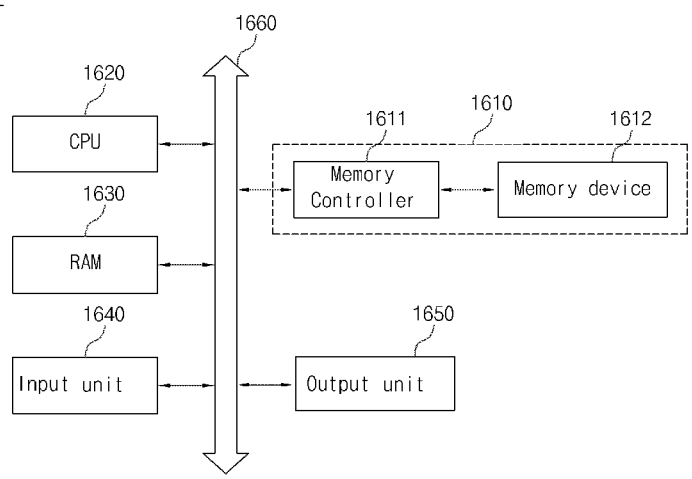
FIG. 22 is a block diagram illustrating a computing system to which the stacked semiconductor package in accordance with various embodiment of the present invention is applied.

FIG. 22 is a view illustrating a computing system which may include the stacked semiconductor package according to various embodiments of the present invention.

Referring to FIG. 22, the computing system 1600 of the present embodiments may include a CPU 1620, a RAM 1630, an input unit 1640, an output unit 1650 and a memory system 1610 which are electrically connected to a system bus 1660. In case that the computing system 1600 is a mobile device, a battery (not shown) for supplying an operation voltage to the computing system 1600 may be further provided. The computing system 1600 of the present invention may further include an application chipset, a CMOS image processor CIS, a mobile DRAM, etc.

The input unit 1640 or output unit 1650 may be a self-contained display in the case of a portable electronic device. The input unit 1640 or output unit 1650 may be a physical keyboard or a virtual keyboard in the case of a portable electronic device such as i.e. a smartphone, tablet pc, laptop, etc. The portable electronic device may further include, without limitation, a trackball, touchpad, or other cursor control device combined with a selection control, such as a pushbutton, to select an item highlighted by cursor manipulation. The memory system 1610 may include a memory controller 1611 and a memory device 1612 as shown in FIG. 21, and the memory device 1612 may comprise the stacked semiconductor package according to various embodiments of the present invention.

While the present invention has been described with respect to the specific embodiments, it will be apparent to those skilled in the art that various changes and modifications may be made without departing from the spirit and scope of the invention as defined in the following claims.

What is claimed is:

1. A method for manufacturing a stacked semiconductor package, comprising the steps of:
    forming a first through electrode in a first semiconductor chip formed at a first surface of a first wafer;
    etching a second surface of the wafer opposing to the first surface such that the first through electrode is protruded above the second surface of the wafer;
    forming a first polymer layer that covers the second surface of the wafer and exposes the first through electrode;
    attaching a first surface of a second semiconductor chip onto the first semiconductor chip by medium of the first polymer layer, the first surface of the second semiconductor chip being formed with a bonding pad having a through hole which corresponds to the first through electrode;
    forming a second polymer layer over the first polymer layer including the second semiconductor chip;
    etching the second polymer layer and the second semiconductor chip to form a via hole which is connected with the through hole and by which the bonding pad and the first through electrode are exposed;
    forming a second through electrode in the via hole and the through hole, the second through electrode being electrically connected with the bonding pad and the first through electrode; and
    individualizing a stacked semiconductor package by cutting the first and second polymer layers and the wafer.

2. The method of claim 1, wherein forming the first polymer layer includes the steps of:
    forming a polymer layer over the second surface of the wafer including the protruded first through electrode; and
    flattening the polymer layer such that the first through electrode is exposed.

3. The method of claim 1, wherein the second semiconductor chip is a semiconductor chip which is cut without back grinding after being manufactured on a wafer.

4. The method of claim 1, further comprising, after attaching the first surface of the second semiconductor chip onto the first semiconductor chip and before forming the second polymer layer, the step of: etching a second surface of the second semiconductor chip, which is opposite to the first surface, to reduce the thickness of the second semiconductor chip.

5. The method of claim 1, further comprising, after forming the via hole and before forming the second through electrode, the steps of:
    forming a second insulation layer over the second polymer layer including the via hole and the through hole;
    forming a second barrier metal layer over the second insulation layer; and
    removing portions of the second insulation layer and the second barrier metal layer formed on the upper portion of the second polymer layer and the bottom of the via hole and the through hole such that the second insulation layer and the second barrier metal layer remain only on the side walls of the via hole and the through hole.

6. The method of claim 1, wherein forming the second through electrode includes the steps of:
    forming a metal layer over the second polymer layer including the via hole and the through hole; and
    removing the metal layer formed over the second polymer layer.

7. The method of claim 1, wherein forming the second through electrode is implemented in a manner of growing a metal layer through an electroless plating process using the first through electrode as a seed layer.

8. The method of claim 1, wherein a unit cycle including attaching the first surface of the second semiconductor chip onto the first semiconductor chip, forming the second polymer layer, forming the via hole and forming the second through electrode is performed at least one time between forming the first polymer layer and individualizing the stacked semiconductor package.

9. The method of claim 1, further comprising, after forming the first through electrode and before making the first through electrode protrude above the second surface of the wafer, the steps of:
    forming a bump over the first surface, the bump being electrically connected with the first through electrode; and
    attaching a support plate to the first surface.

10. The method of claim 9, further comprising, after forming the second through electrode and before individualizing the stacked semiconductor package, the step of: removing the support plate.

11. The method of claim 10, further comprising, after forming the second through electrode and before removing the support plate, the step of attaching a dicing tape onto the second polymer layer.

* * * * *